(12) United States Patent
Baldo et al.

(10) Patent No.: US 8,072,217 B2
(45) Date of Patent: Dec. 6, 2011

(54) MAGNETIC RESONANCE PHANTOM SYSTEMS AND METHODS

(75) Inventors: John H. Baldo, Fort Collins, CO (US); Herman Lock, Wellington, CO (US); Layne E. Howard, Los Gatos, CA (US); Michael R. Meiler, Longmont, CO (US); Mark S. Brown, Arvada, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 273 days.

(21) Appl. No.: 12/443,816

(22) PCT Filed: Sep. 5, 2007

(86) PCT No.: PCT/US2007/019372
§ 371 (c)(1),
(2), (4) Date: Mar. 31, 2009

(87) PCT Pub. No.: WO2008/030475
PCT Pub. Date: Mar. 13, 2008

(65) Prior Publication Data
US 2010/0013482 A1    Jan. 21, 2010

Related U.S. Application Data

(60) Provisional application No. 60/843,069, filed on Sep. 8, 2006.

(51) Int. Cl.
*G01V 3/00* (2006.01)
(52) U.S. Cl. ........................................ 324/318; 324/309
(58) Field of Classification Search .......... 324/300–322; 600/407–445
See application file for complete search history.

(56) References Cited

U.S. PATENT DOCUMENTS

| | | | |
|---|---|---|---|
| 4,551,678 A | 11/1985 | Margan et al. | |
| 4,613,819 A | 9/1986 | Chui | |
| 4,618,826 A | 10/1986 | Smith et al. | |
| 4,644,276 A | 2/1987 | Sierocuk et al. | |
| 4,692,704 A | 9/1987 | Gray | |
| 4,888,555 A | 12/1989 | Vaughan et al. | |
| 5,036,280 A | 7/1991 | Chesavage | |
| 5,165,050 A | 11/1992 | Goodenough et al. | |
| 5,312,755 A | 5/1994 | Madsen et al. | |
| 6,605,942 B1 * | 8/2003 | Warren | 324/307 |
| 6,635,486 B2 * | 10/2003 | Madsen et al. | 436/8 |
| 7,368,912 B2 * | 5/2008 | Kreibich | 324/307 |

(Continued)

FOREIGN PATENT DOCUMENTS

DE    4314743    11/1993

(Continued)

*Primary Examiner* — Brij Shrivastav

(57) ABSTRACT

According to one aspect, a magnetic resonance (NMR or MRI) phantom includes a spherical or quasi-spherical casing enclosing an internal chamber, and an internal phantom structure situated within the internal chamber. The casing includes alignment features allowing the sequential alignment/orientation of the phantom along three orthogonal axes. In some embodiments, the casing is shaped as a quasi-spherical intercyl having an outer surface defined by the intersection of three orthogonal cylinders. In some embodiments, the casing may be shaped as a sphere having orthogonal registration holes or channels sized to accommodate a corresponding protrusion or ridge in a phantom holder; the casing may also include protrusions or ridges sized to fit into a matching hole or channel defined in a holder. One or more internal phantom plates may include air bubble transfer apertures allowing air bubbles to flow between opposite sides of a plate as a liquid-filled phantom is rotated.

20 Claims, 17 Drawing Sheets

U.S. PATENT DOCUMENTS

| | | | |
|---|---|---|---|
| 7,462,488 B2 * | 12/2008 | Madsen et al. | 436/8 |
| 2003/0086535 A1 | 5/2003 | Teppaz et al. | |
| 2004/0102691 A1 | 5/2004 | Mallozzi et al. | |
| 2010/0237867 A1 * | 9/2010 | Slade | 324/314 |
| 2011/0130660 A1 * | 6/2011 | Cloutier et al. | 600/438 |

FOREIGN PATENT DOCUMENTS

| | | |
|---|---|---|
| EP | 1074220 | 2/2001 |
| EP | 1128189 | 8/2001 |
| JP | 61275644 | 12/1986 |
| WO | WO 2004/106962 | 12/2004 |

* cited by examiner

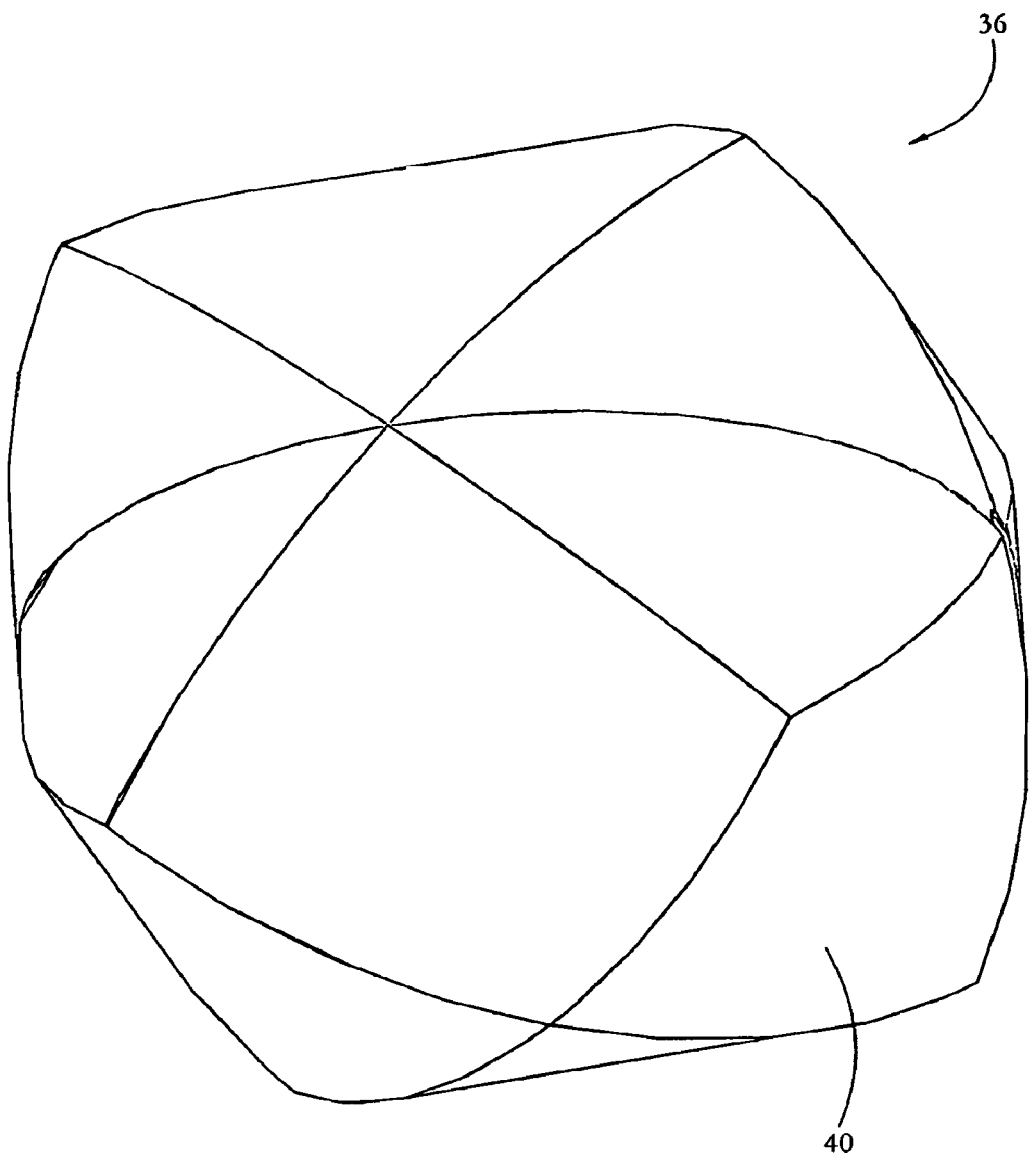
FIG. 4-A

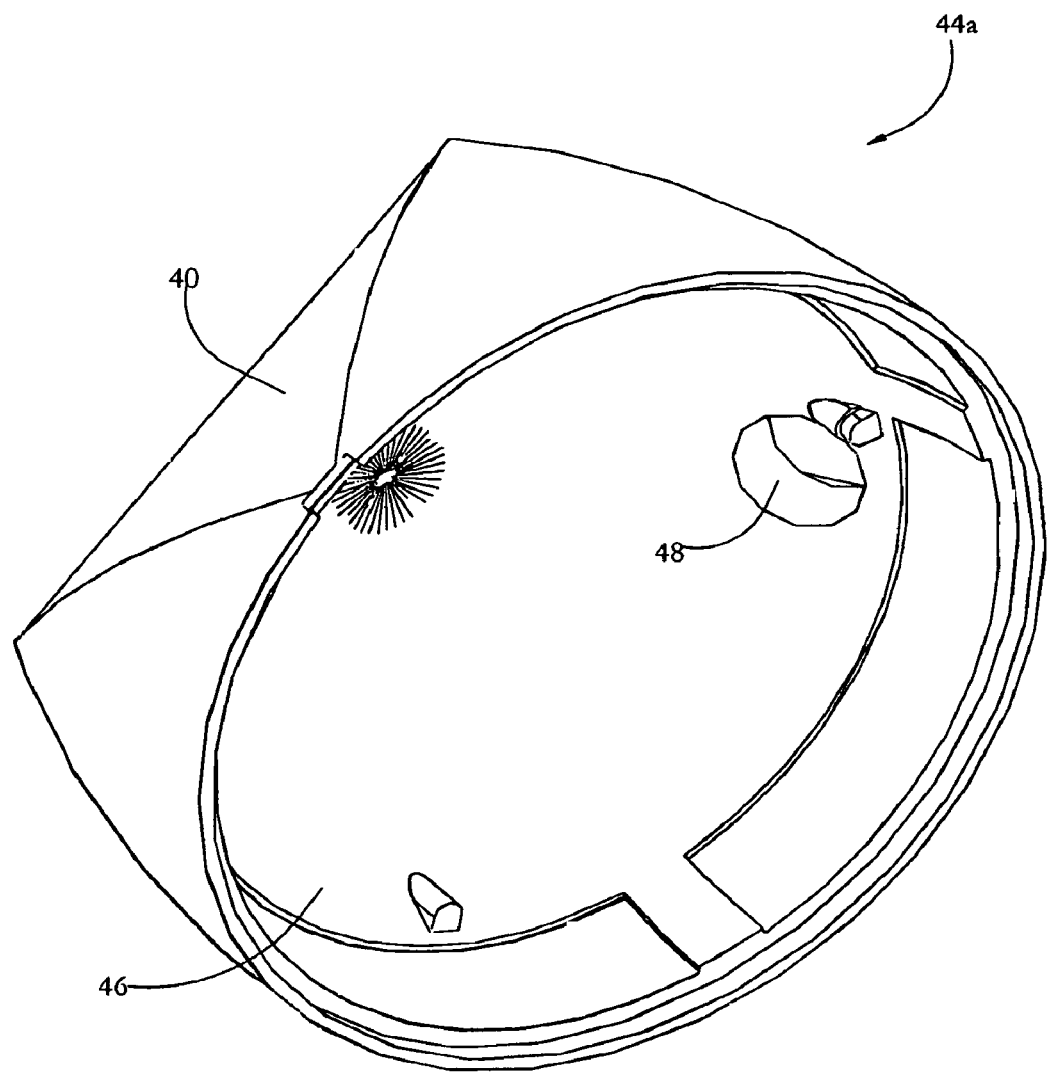
FIG. 4-B

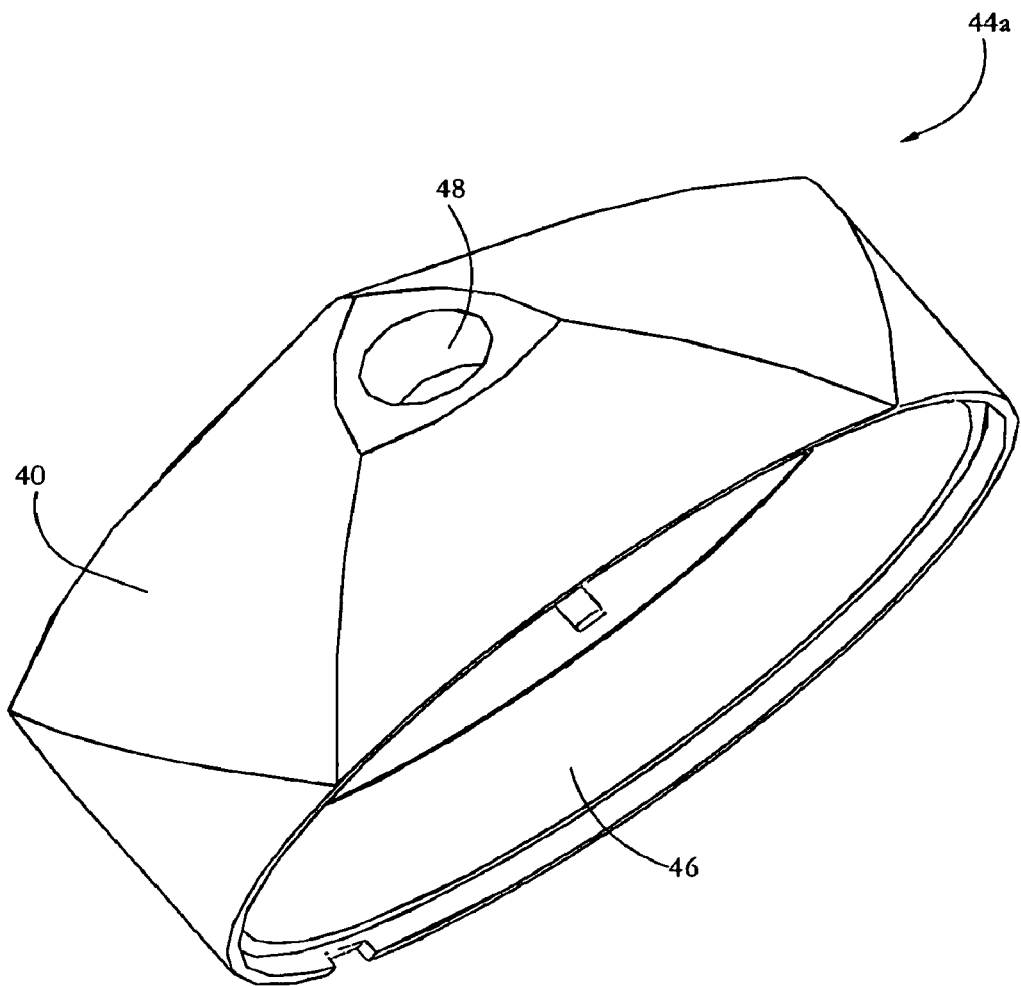
FIG. 4-C

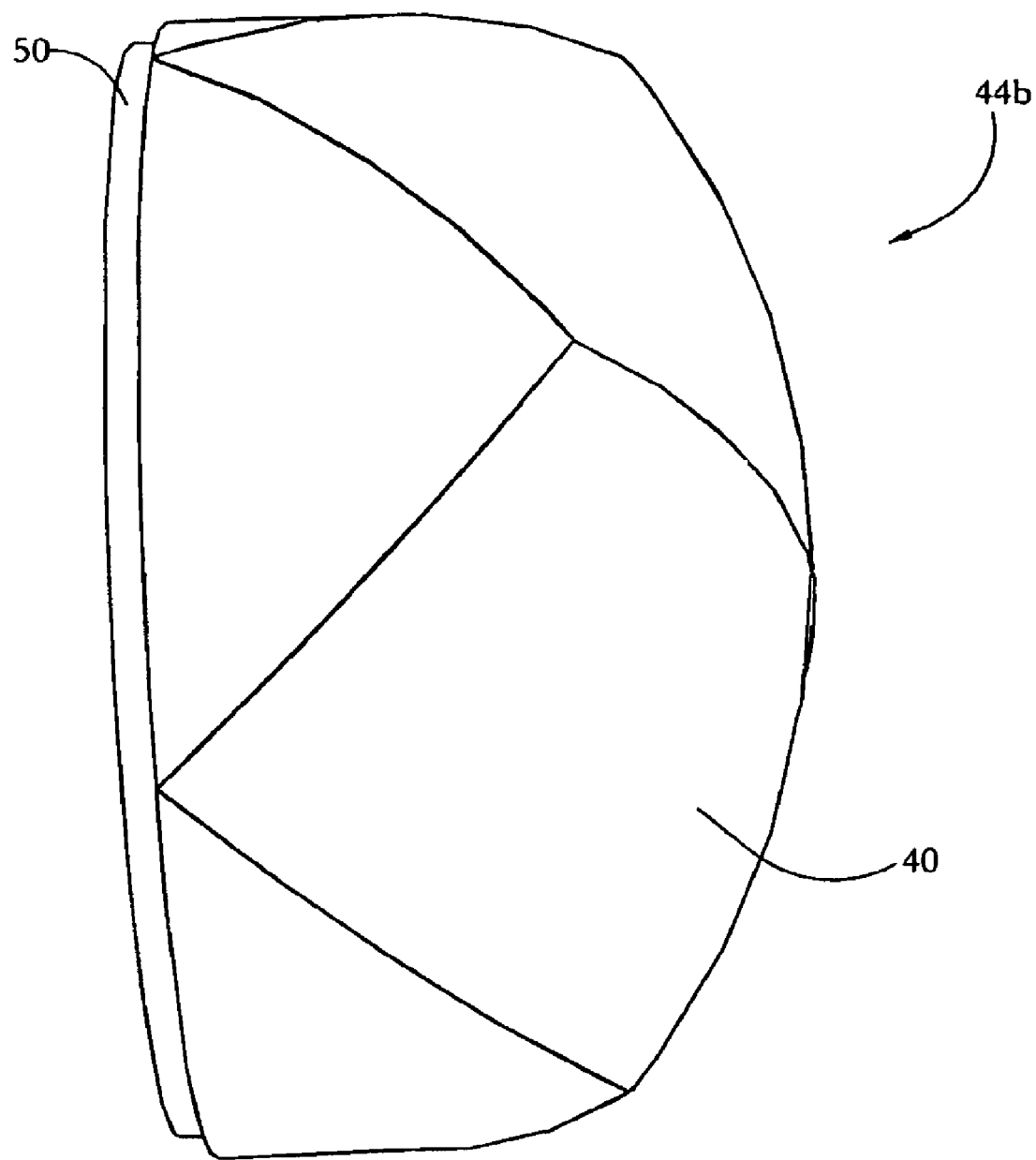
FIG. 4-D

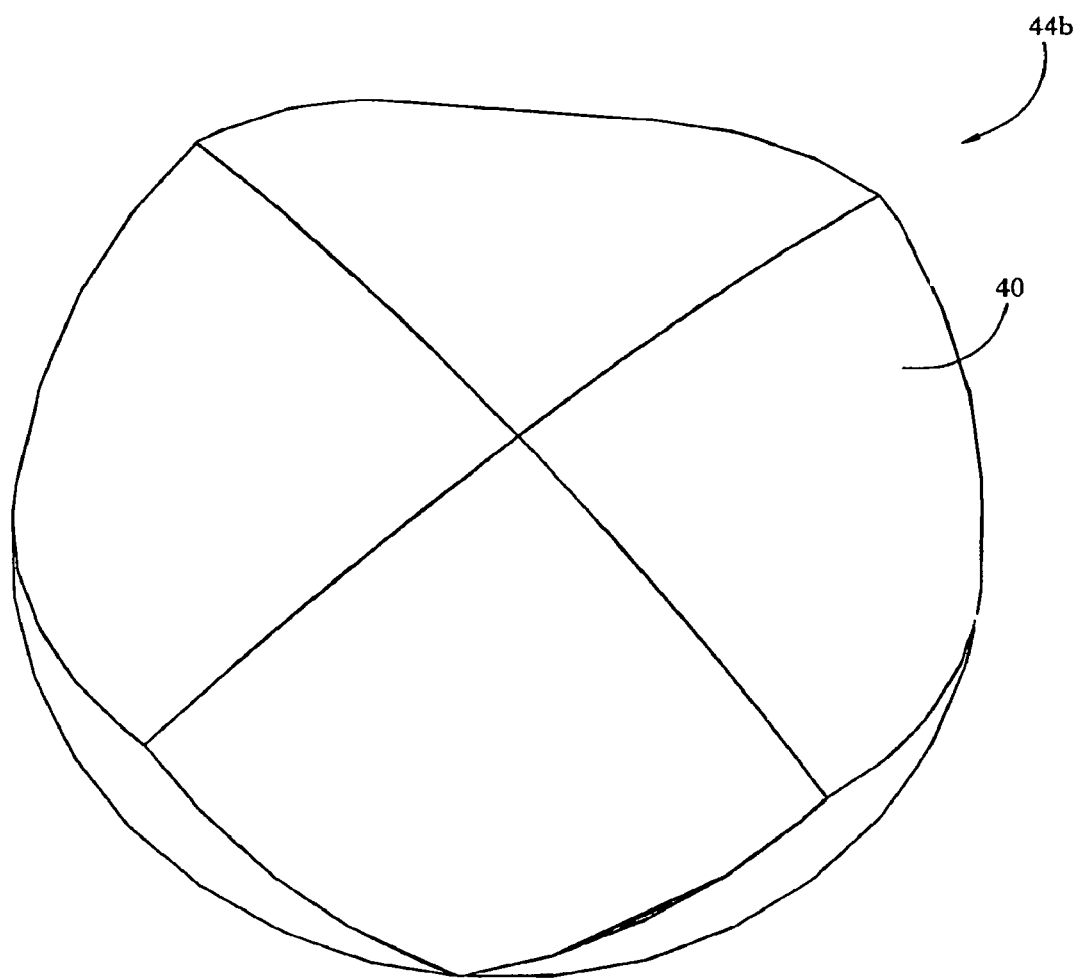
FIG. 4-E

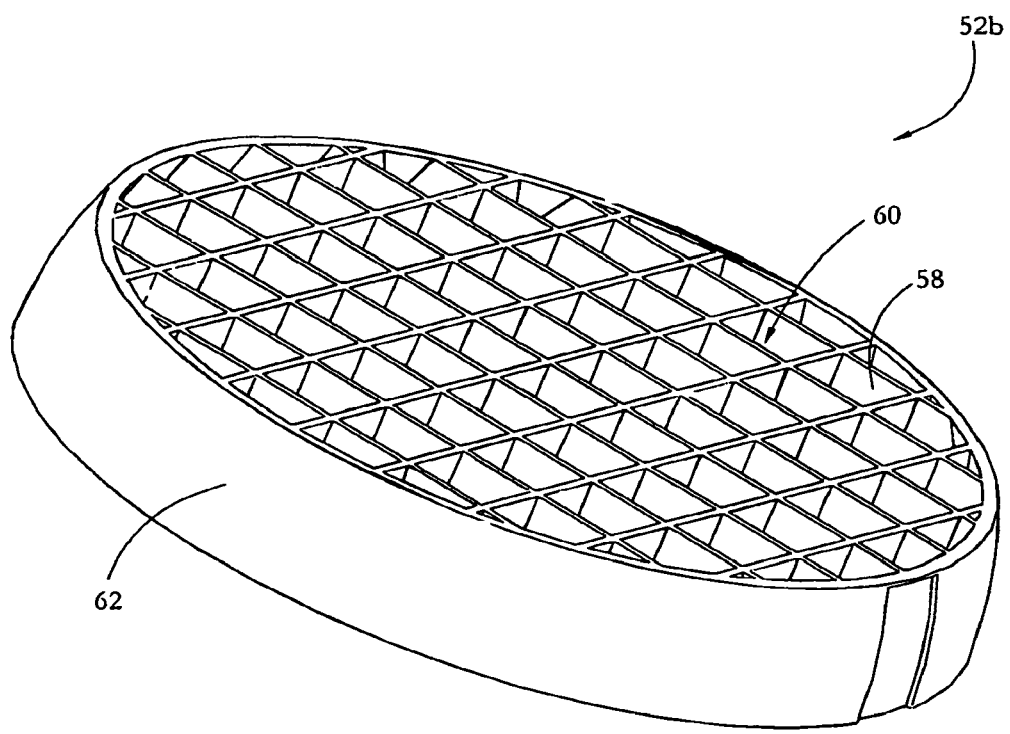
FIG. 7-A

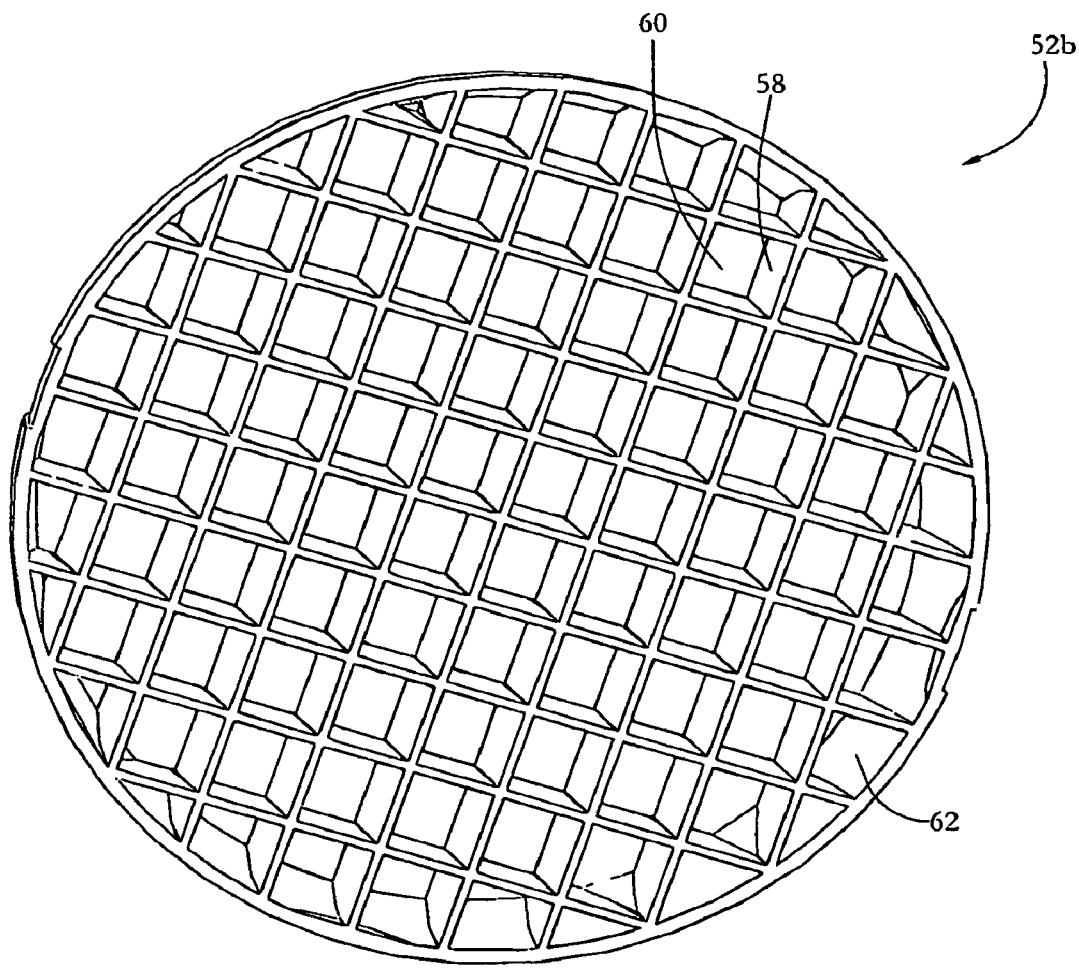
FIG. 7-B

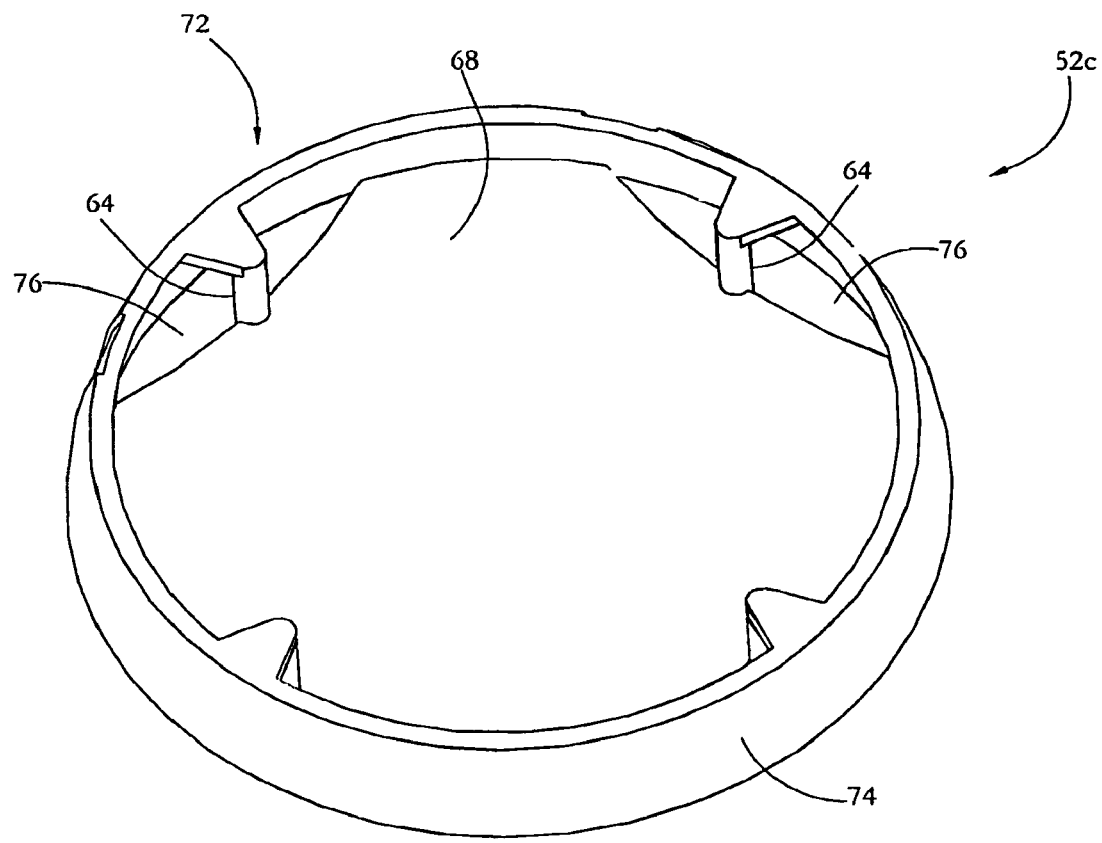
FIG. 8-A

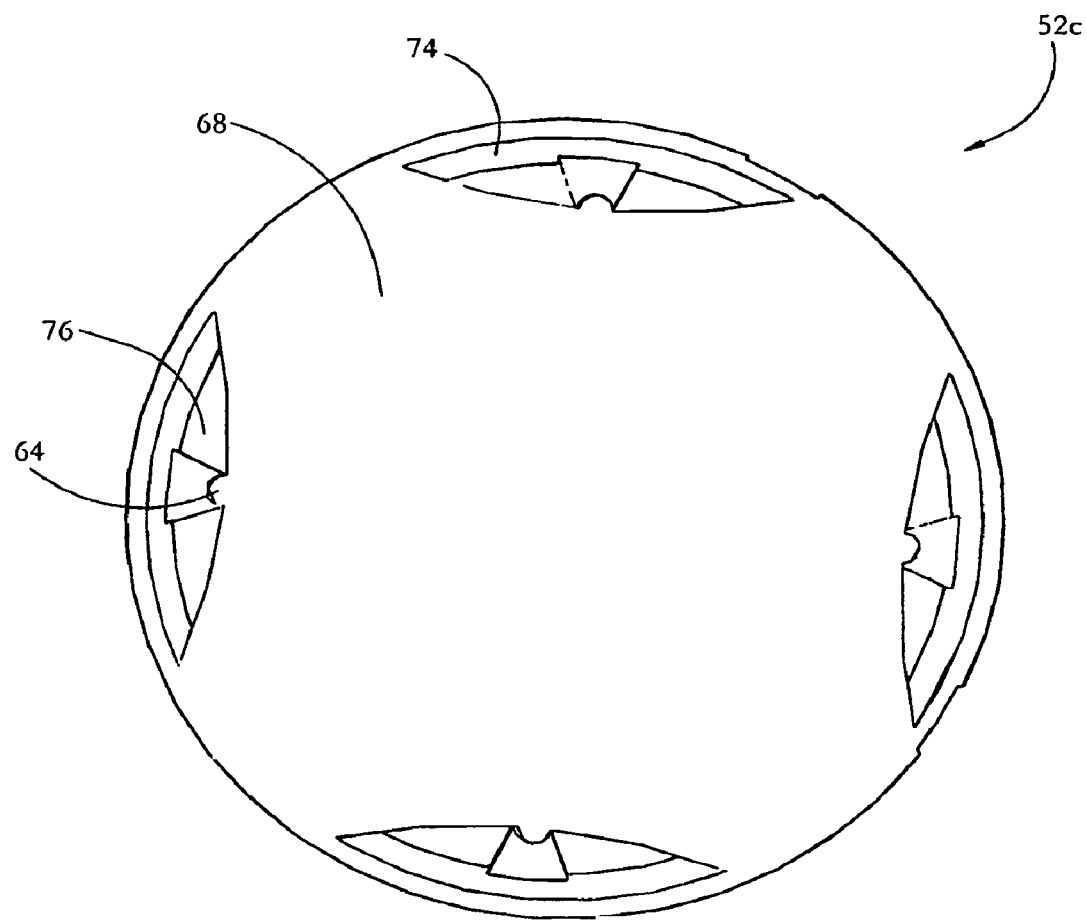
FIG. 8-B

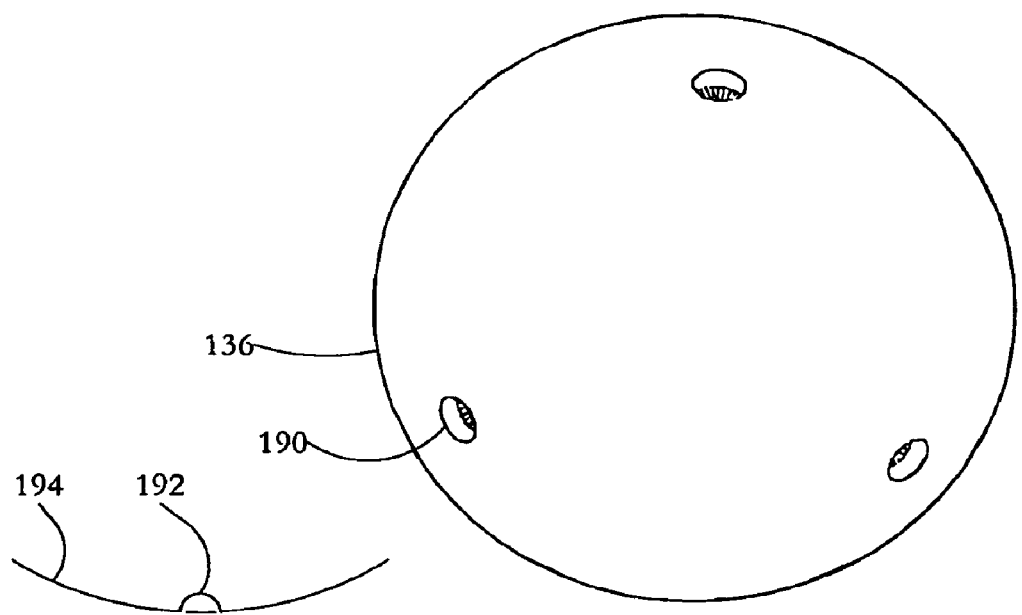
FIG. 10-A
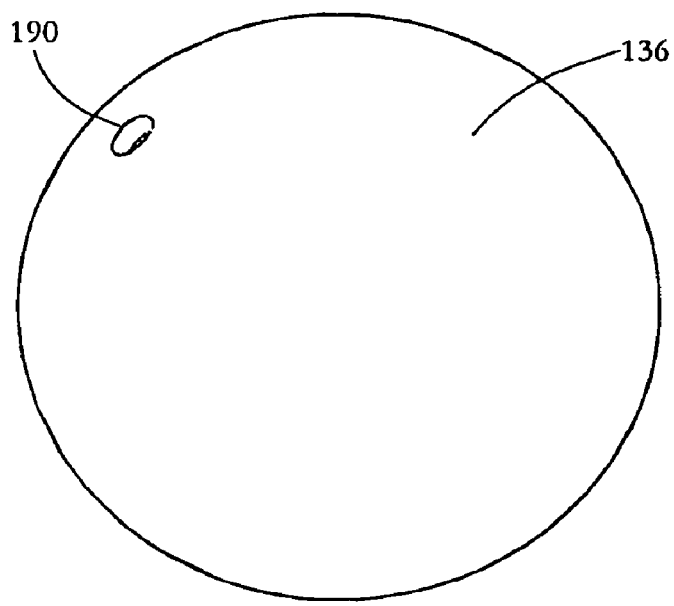
FIG. 10-B

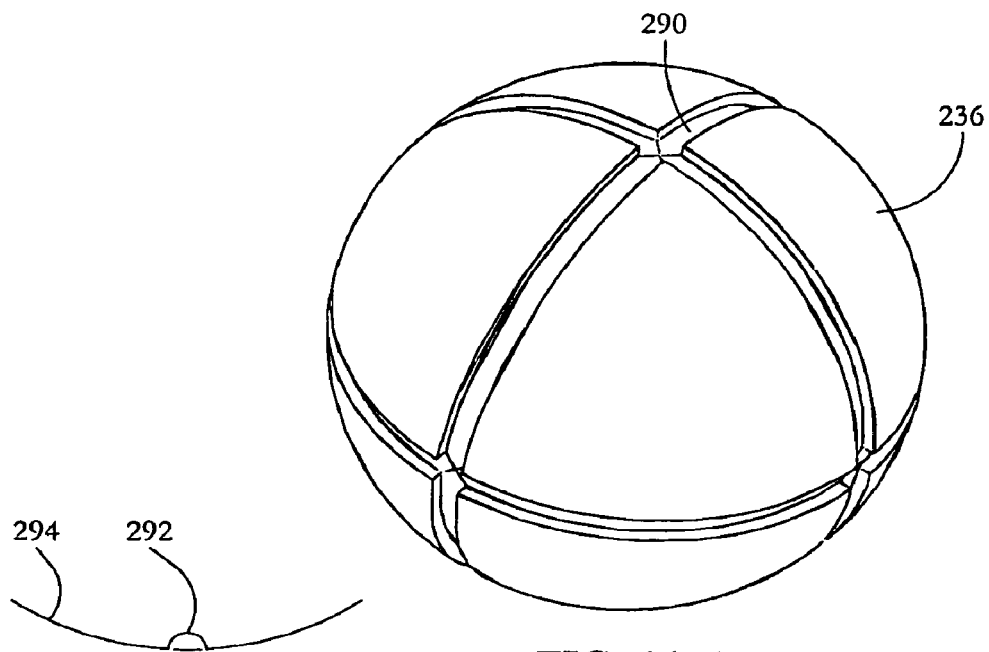
FIG. 11-A
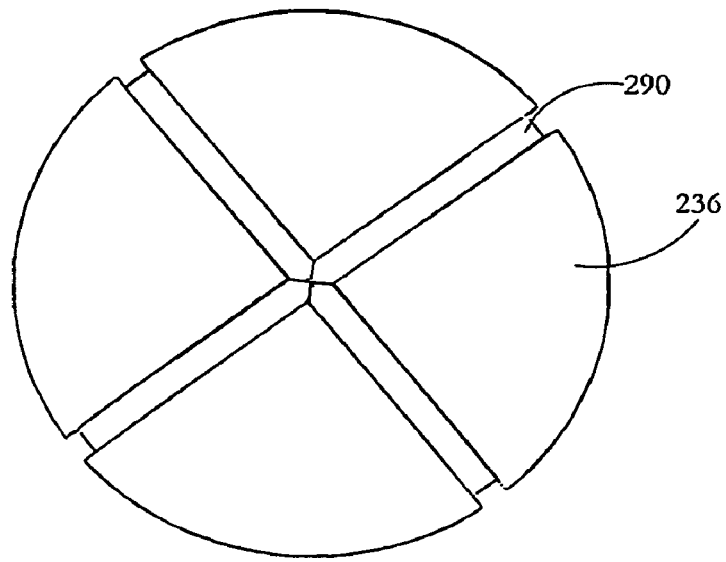
FIG. 11-B

MAGNETIC RESONANCE PHANTOM SYSTEMS AND METHODS

RELATED APPLICATION DATA

This application claims the benefit of the filing date of U.S. Provisional Application No. 60/843,069 filed Sep. 8, 2006.

FIELD OF THE INVENTION

This invention relates to magnetic resonance system and methods, and in particular to phantom systems and methods for NMR and/or MRI.

BACKGROUND OF THE INVENTION

Magnetic resonance phantoms are relatively-complex structures used to evaluate and/or calibrate magnetic resonance (MR) devices such as nuclear magnetic resonance (NMR) spectrometers and magnetic resonance imaging (MRI) devices. During a calibration/evaluation process, a phantom is inserted into a cylindrical measurement space within a MR device in order to perform a number of calibration and/or evaluation steps such as performing a gradient calibration, and/or measuring device resolution, gradient distortion/linearity, and slice gap and thickness.

In a common configuration, a MR phantom includes a cylindrical casing enclosing a fluid-filled chamber containing a number of phantom spatial features. For examples of MR phantoms having cylindrical casings see for example U.S. Pat. Nos. 5,036,280, 5,888,555, 4,777,442, 4,719,406, 4,692,704, 4,618,826, and 4,613,819.

In U.S. Pat. No. 4,533,276, Sierocuk et al. describe an NMR phantom including three mutually-orthogonal test plates, each configured to enable testing NMR scanner performance in each of the planes containing the plates. The plates are arranged to be simultaneously positionable at the isocenter of the NMR scanner to permit testing NMR scanner performance in each plane without repositioning the phantom.

SUMMARY OF THE INVENTION

According to one aspect, a magnetic resonance (NMR/MRI) phantom comprises a casing enclosing an internal chamber, the casing having an outer surface defined by an intersection of three identical, orthogonal circular right cylinders; and an internal magnetic resonance phantom structure positioned within the internal chamber.

According to another aspect, a magnetic resonance phantom comprises a spherical or quasi-spherical casing enclosing an internal chamber, the casing including a plurality of orthogonal alignment fiducials for aligning the casing alternatively in three mutually-orthogonal directions within a magnetic resonance instrument; and an internal magnetic resonance phantom structure positioned within the internal chamber.

According to another aspect, a magnetic resonance phantom comprises a casing enclosing an internal chamber; and an internal magnetic resonance phantom structure comprising a plurality of stacked plates positioned within the internal chamber. The plurality of plates includes a plate having a base, a side wall extending transversely away from the base along a perimeter of the base, and a set of air bubble transfer passages defined substantially along the perimeter of the base, for allowing air bubbles formed in a liquid situated within the internal chamber to pass between opposite sides of the base as the phantom is rotated.

According to another aspect, a method comprises orienting a spherical or quasi-spherical magnetic resonance phantom sequentially in three orthogonal orientations within a magnetic resonance instrument by sequentially aligning a plurality of alignment fiducials of the phantom with a matching fiducial of the magnetic resonance instrument, the magnetic resonance phantom including a spherical or quasi-spherical casing enclosing an internal chamber and an internal magnetic resonance phantom structure situated within the internal chamber; and performing a magnetic resonance evaluation of the phantom in each of the three orthogonal orientations.

BRIEF DESCRIPTION OF THE DRAWINGS

The foregoing aspects and advantages of the present invention will become better understood upon reading the following detailed description and upon reference to the drawings where:

FIGS. 4-A-E show isometric views of an external casing of the phantom of the assembly of FIG. 2, according to some embodiments of the present invention.

FIGS. 7-A-B show a grid plate of the internal phantom structure of FIG. 5, according to some embodiments of the present invention.

FIGS. 8-A-B show a spatial fiducial plate of the internal phantom structure of FIG. 5, according to some embodiments of the present invention.

FIGS. 10-A-B show a phantom casing having round registration surface holes shaped as recessed dimples, according to some embodiments of the present invention.

FIGS. 11-A-B show a phantom casing having circumferential registration slots/channels, according to some embodiments of the present invention.

DETAILED DESCRIPTION OF THE INVENTION

The following description illustrates the present invention by way of example and not necessarily by way of limitation. Any reference to an element is understood to refer to at least one element. A set of elements is understood to include one or more elements. A plurality of elements includes at least two elements. A generally-round shape encompasses, among others, spherical and quasi-spherical shapes.

The following description illustrates embodiments of the invention by way of example and not necessarily by way of limitation.

Figure 1:
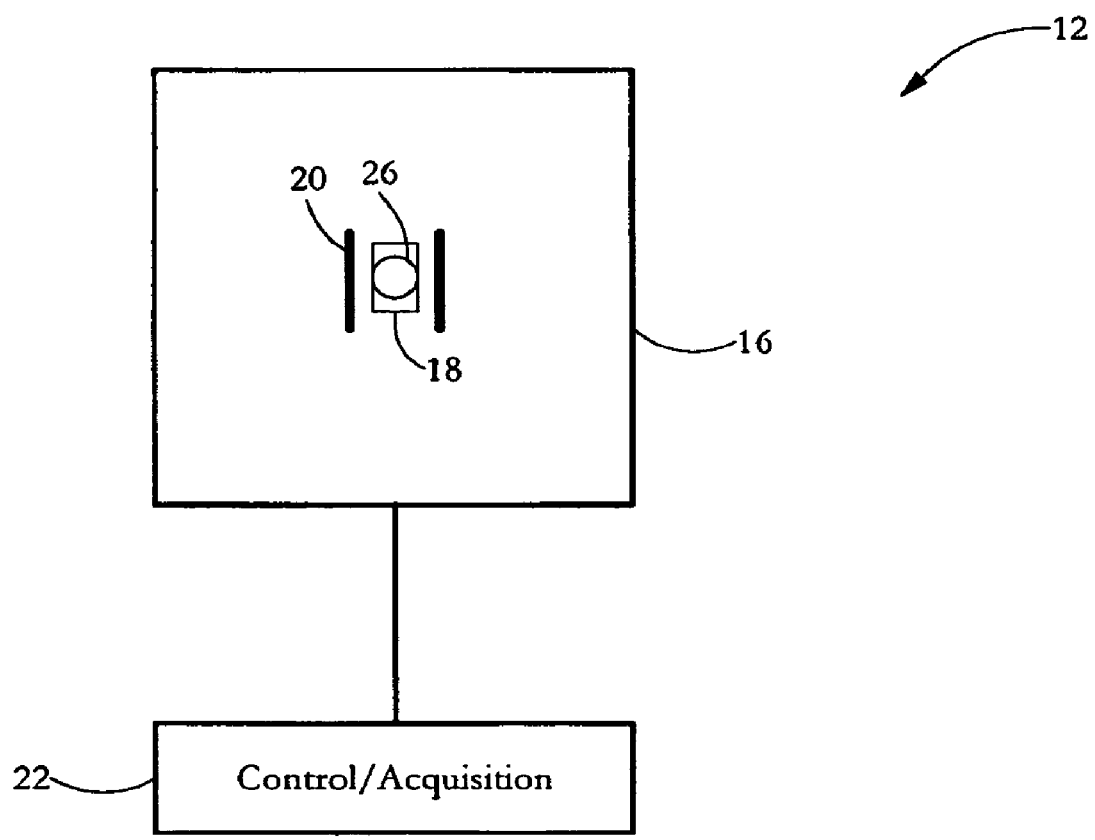
FIG. 1 shows an exemplary magnetic resonance instrument according to some embodiments of the present invention.

FIG. 1 is a schematic diagram illustrating an exemplary nuclear magnetic resonance (NMR) spectrometer 12 according to some embodiments of the present invention. Spectrometer 12 comprises a magnet 16, a set of RF coils 18 situated in a central region of magnet 16, a set of coils 20 including shim and gradient coils, and a control/acquisition system (console) 22 electrically connected to magnet 16, coils 18, 20 and other components of spectrometer 12.

To perform NMR measurements, samples of interest are inserted sequentially in a measurement space defined at the center of magnet 16, within coils 18. Magnet 16 applies a static magnetic field $B_0$. Shim coils are used to correct spatial inhomogeneities in the static magnetic field $B_0$, while gradient coils are used to generate magnetic field gradients. Control/acquisition system 22 comprises electronic components configured to apply desired radio-frequency pulses to coils 18, and to acquire data indicative of the nuclear magnetic resonance properties of the samples. Coils 18 are used to apply radio-frequency magnetic fields $B_1$ to the sample, and/or to measure the response of the sample to the applied magnetic fields. The RF magnetic fields are perpendicular to the static magnetic field.

To perform a quality assurance (evaluation/calibration) process, a magnetic resonance phantom 26 is positioned in a measurement space defined at the center of magnet 16, within coils 18. Performed quality assurance steps may include gradient calibration and determinations of parameters such as image distortion, resolution, slice thickness, and inter-slice gap.

Figure 2:
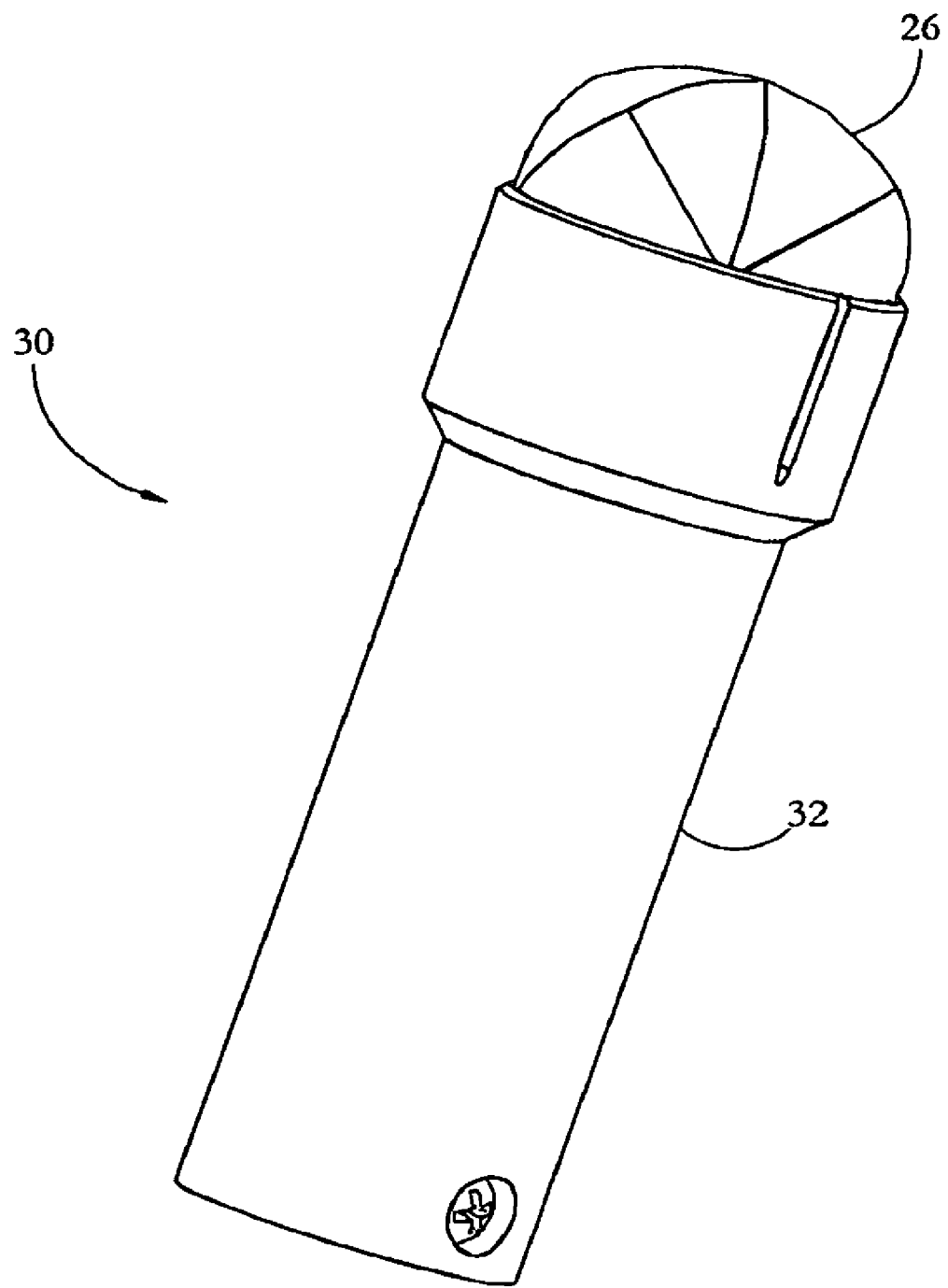
FIG. 2 shows a nuclear magnetic resonance instrument evaluation assembly including a phantom and a holder for supporting the phantom within a nuclear magnetic resonance instrument, according to some embodiments of the present invention.

FIG. 2 shows a nuclear magnetic resonance instrument evaluation assembly 30 including phantom 26 and a holder 32 supporting phantom 26 in a fixed position and orientation within RF coils 18 (FIG. 1) while quality assurance measurements are performed.

Figure 3:
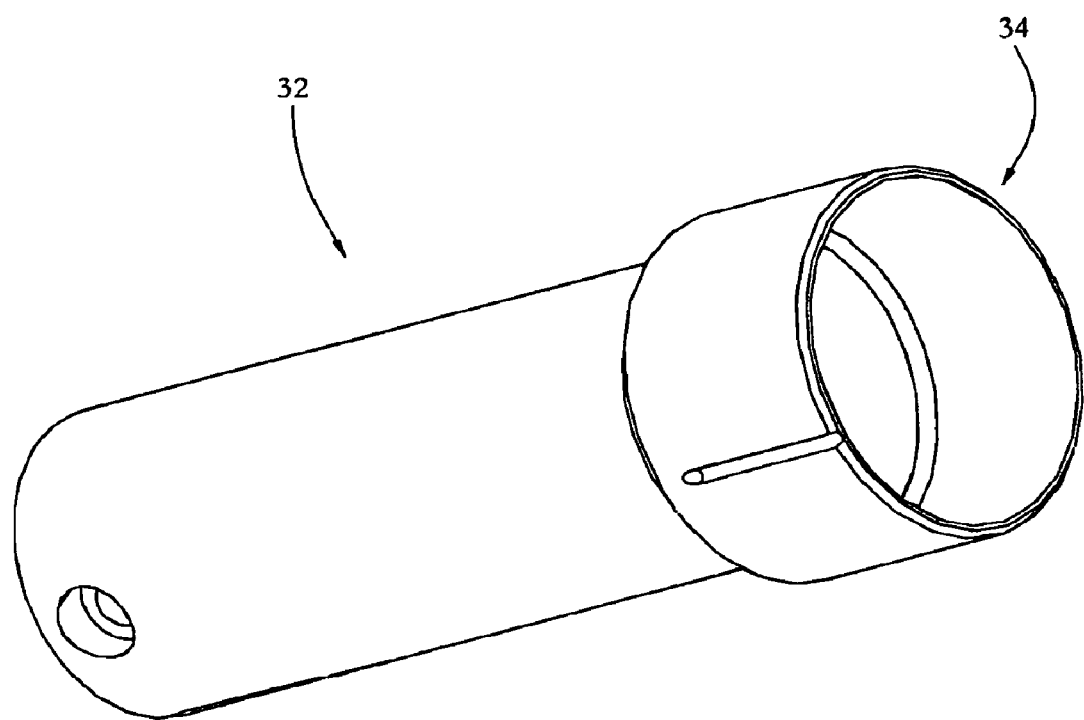
FIG. 3 shows the holder of the assembly of FIG. 2, according to some embodiments of the present invention.

FIG. 3 shows an isometric view of holder 32. Holder 32 includes a cylindrical phantom holding and registration opening 34 for receiving phantom 26 (FIG. 2) and holding phantom 26 in a fixed position and orientation relative to holder 32. Opening 34 interfaces with the external surface of phantom 26, providing a fixed alignment of one of the principal axes of phantom 26 with holder 32. Holder 32 is in turn aligned with one axis of the imaging system, for example the z-axis of magnet 16, thereby providing positive alignment between the magnetic resonance system and phantom 26. Holder 32 also secures phantom 26 in position against accidental dislodgment.

Figure 5:
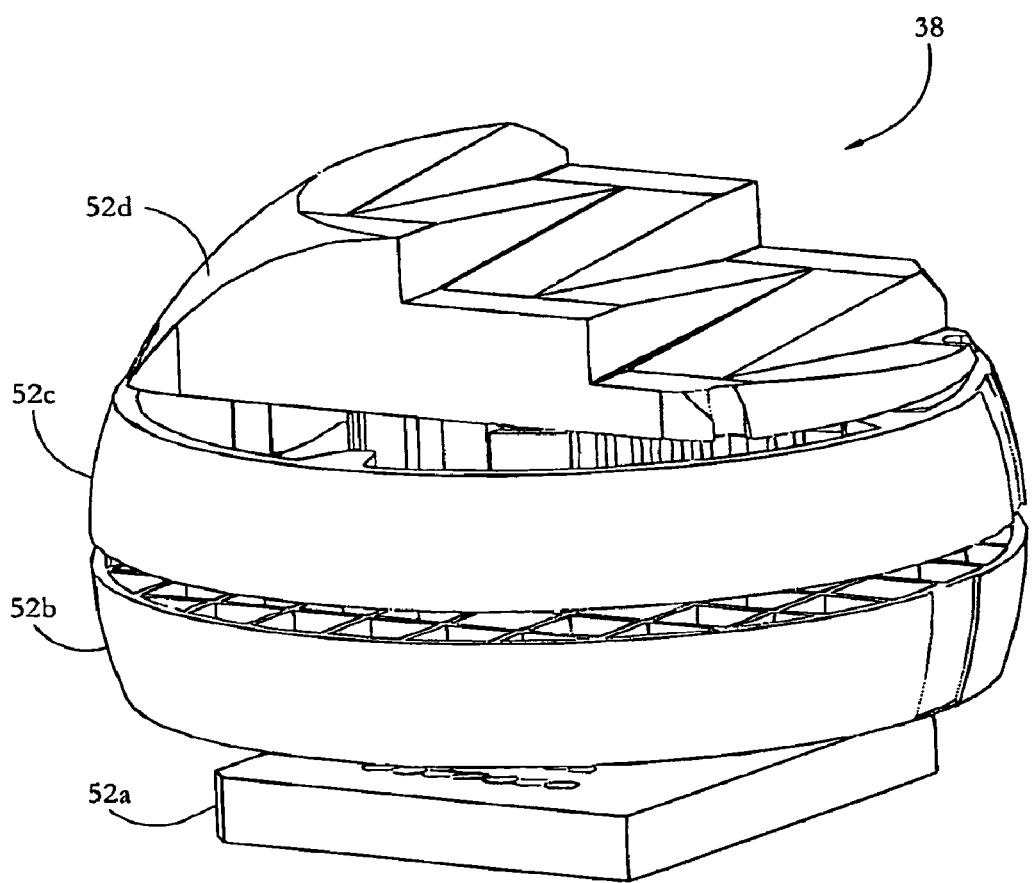
FIG. 5 shows an isometric view of an internal phantom structure comprising a plurality of stacked plates situated in an internal chamber defined within the casing of FIGS. 4-A-E, according to some embodiments of the present invention.

Phantom 26 includes a casing (shell) 36 enclosing an internal chamber (FIGS. 4-A-E), and an internal phantom structure 38 situated within the internal chamber (FIG. 5). The internal chamber may be filled with a liquid such as water while quality assurance measurements are performed. As shown in FIG. 4-A, casing 36 has a generally-rounded, quasi-spherical shape, and has a phantom/holder registration outer surface 40 having a shape defined by the intersection of three identical, orthogonal cylinders. The shape is hereinafter referred for brevity as a "cylisphere" or "intercyl." The shape allows holding the phantom in one of three predetermined orthogonal (x-y-z) orientations within the cylindrical registration opening 34 (FIG. 3). The diameter of registration opening 34 matches the diameters of the intersecting orthogonal cylinders defining the outer surface of casing 36.

Casing 36 includes top and bottom halves connected together. FIGS. 4-B-C show isometric view of a bottom half 44a of casing 36, while FIGS. 4-D-E show isometric views of a top half 44b of casing 36. As shown in FIGS. 4-B-C, casing 36 has a spherical internal surface 46 enclosing a spherical internal chamber. A liquid access aperture 48 passes through casing 36, and allows water or another liquid to be inserted and taken out of the internal chamber of phantom 26. As shown in FIG. 4-D, top half 44b includes an equatorial connection ridge 50 which engages bottom half 44a to connect top half 44b to bottom half 44b, thus sealing the internal chamber holding internal phantom structure 38.

FIG. 5 shows an isometric view of internal phantom structure 38. Phantom structure 38 includes a plurality of stacked circular phantom plates 52a-d. Plates 52a-d may be affixed in place within casing 36 by friction, adhesive, and/or fasteners. Plates 52a-d may be interlocked with casing 36 to provide alignment registration of the plates 52a-d within casing 36. A hole array plate 52a and a grid plate 52b occupy one half of casing 36, while a spatial fiducial plate 52c and a folded ramp plate 52d occupy the opposite half. In some embodiments, plates with other features such as fans, intersecting ramps, concentric cones, flood planes and others can be interchangeably mounted within casing 36. In some embodiments, particularly in relatively large embodiments where there is additional capacity within the phantom 26, other plates can be added without substitution.

Figure 6:
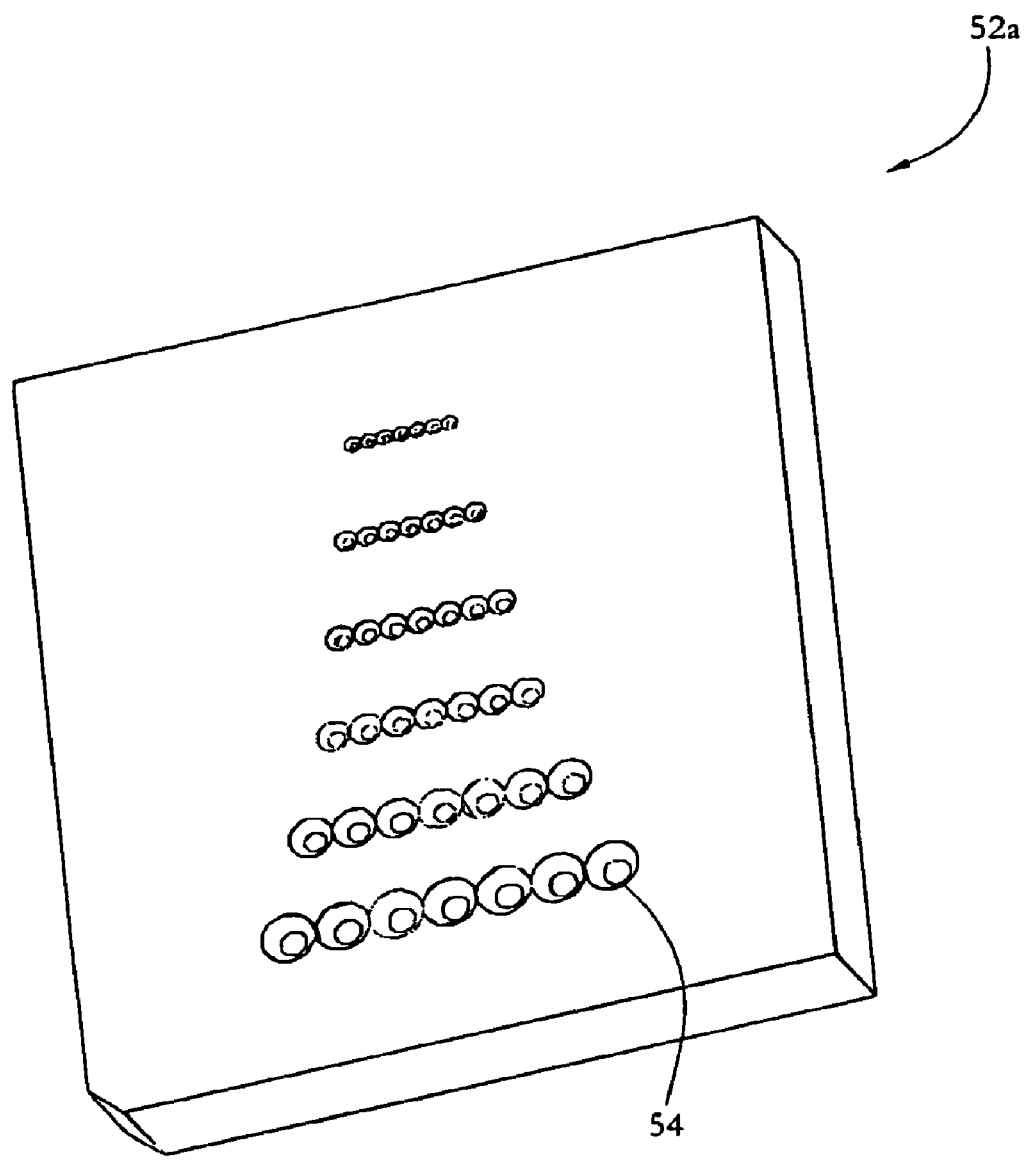
FIG. 6 shows a hole array plate of the internal phantom structure of FIG. 5, according to some embodiments of the present invention.

FIG. 6 shows an isometric view of hole array plate 52a. Hole array plate 52a may be used to evaluate instrument resolution. Hole array plate 52a includes a 2-D array of longitudinal holes 54 of varying sizes extending through plate 52a.

FIGS. 7-A-B show two isometric views of a grid plate 52b. Grid plate 52b may be used to evaluate gradient distortion and/or linearity. Grid plate 52b includes a two-dimensional array of intersecting strips 58 defining a grid. The grid defines a plurality of longitudinal apertures 60 extending through grid plate 52b. The grid is laterally bounded by a spherically-curved side wall 62.

FIGS. 8-A-B show two isometric views of spatial fiducial plate 52c. Spatial fiducial plate 52c may be used for gradient calibration. Plate 52c includes a plurality of longitudinal fiducial pins 64 extending away from a solid planar base 68. In the exemplary configuration shown, four pins 64 are arranged at uniform intervals along a circumference (perimeter) 72 of base 68. A circular, spherically-curved side wall 74 extends longitudinally away from base 68 along circumference 72.

Plate 52c also includes a plurality of air bubble transfer apertures (passages) 76 passing through base 68 along an outer region of plate 52c, for example along circumference 72. Air bubble transfer apertures 76 allow air bubbles formed in the liquid surrounding plate 52c to pass along the outer edge of plate 52c and rise to the top of the phantom 26 as the phantom 26 is rotated in different orientations, rather than become trapped in the space between base 68 and side wall 74. Allowing bubbles to rise to the top of the phantom 26 reduces the presence of the air bubbles in the middle region of the phantom 26, which is the main imaging area. As the phantom 26 is rotated, bubbles tend to travel along the circumference of base 68. Air bubble transfer apertures 76 may be arranged at periodic intervals along the circumference of base 68, to allow air bubbles to pass from one side of base 68 to the other regardless of the orientation and direction of rotation of the phantom 26. Air bubbles may be of particular concern in structured phantoms which have many internal structures to trap bubbles, and/or in small structured phantoms where various phantom features are relatively close together.

Figure 9:
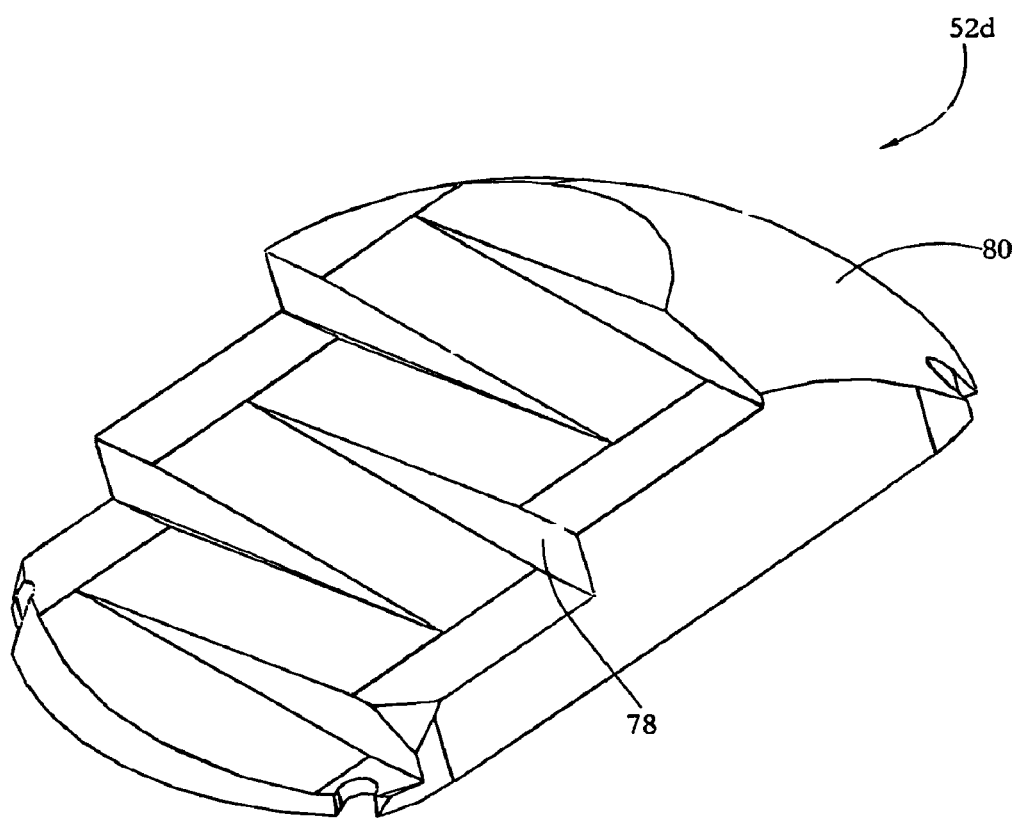
FIG. 9 shows a folded ramp plate of the internal phantom structure of FIG. 5, according to some embodiments of the present invention.

FIG. 9 shows an isometric view of folded ramp plate 52d. Folded ramp plate 52d may be used to measure MRI slice thickness, and, for multiple slices, the slice gap. Folded ramp plate 52d includes a plurality of folded ramp steps 78 and a spherically-curved back surface 80.

In some embodiments, as shown in FIGS. 10-A-B and 11-A-B, a phantom casing may have a spherical or other rounded shape, coupled with external registration (alignment) features or fiducials capable of holding the phantom sequentially aligned in several positions within a holder.

FIGS. 10-A-B show a phantom casing 136 having three round registration surface holes 190 shaped as recessed dimples, according to some embodiments of the present invention. A corresponding phantom holder includes a matching protruding dimple/pin 192 situated at the bottom of a spherically-shaped phantom-receiving surface 194. The phantom can be oriented in one of three orthogonal orientations by placing one of the registration holes 190 over the corresponding holder protrusion 192. In some embodiments, the holder may include a recess, and the phantom may include multiple protrusions.

FIGS. 11-A-B show a phantom casing 236 having three orthogonal circumferential (equatorial) registration slots/channels 290, according to some embodiments of the present invention. A corresponding phantom holder includes a matching circular protruding ridge 292 extending across the bottom of a spherically-shaped phantom-receiving surface 294. The phantom can be oriented in one of three orthogonal orientations by placing one of the registration channels 290 over the corresponding holder protrusion 292. In some embodiments, the holder may include a recessed channel, and the phantom may include circumferential protrusions.

In some embodiments, the described phantoms may be a miniaturized phantoms having an overall size (e.g. diameter) on the order of 1-10 cm, for example about 30 mm. Some magnetic resonance instrument bore sizes may range from about 1 to 10 inches, and in some embodiments, a phantom may have an overall size matching the instrument bore size. In some embodiments, the various structures of the phantom are built by rapid prototyping techniques such as stereolithography or related techniques that build up or deposit material to construct structures.

Constructing the phantom from several components allows using different base materials and processing methods for the individual components. For example, in some embodiments, a machinable engineering plastic may be used for the hole array plate, while UV-curing plastics (e.g. plastics available from DSM Somos, such as Nanoform 15120) may be used for the other types of plates described above and/or for the phantom casing. As examples, a transparent UV-curing plastic may be used for the phantom casing, while an opaque UV-curing plastic may be used for one or more of the phantom plates.

Common commercially available structural phantoms used in the clinical marketplace are sized for usage in a whole body MRI scanner having a clinical head RF coil. The components of such phantoms may be made by classical machining of plastic shapes. Such a manufacturing approach may become uneconomical as the imaging volume is reduced. In one test of manufacturing by machining, reducing the linear phantom size by a factor of three resulted in an increase in manufacturing costs by a factor of five. Stereolithography may allow the economical production of phantom structures having relatively small sizes.

Common clinical structural phantoms are commonly made as right cylinders, and fit readily inside a head RF coil. For a phantom shaped as a right cylinder it may not be practicable to rotate the phantom into alignment with all principal axes. A relatively large phantom may include repeat features allowing different axes to be tested without moving the phantom.

A spherical or quasi-spherical shape may allow the phantom to be aligned to all axes so that the same determination is performed for each axis without favoring a particular axis. Providing for phantom rotation may also allow simplifying the interior structure of the phantom by removing redundant structures. A spherical shape may also have an advantage over a right cylinder in that its internal magnetic susceptibility imparts less distortion to the magnetic field.

The intercyl/cylisphere and registered spherical shapes described above provide an advantageous way of orienting the phantom with the holder. The shapes allow unique placement of the phantom along the principal axes while providing maximal internal volume. The shape of the phantom may be chosen to be approximately spherical, to allow the phantom to be easily rotated to lie along the principal axes. The intercyl shape allows correct alignment of the phantom in all three major orthogonal planes to facilitate system adjustments and image calibration. The intercyl shape provides a unique compromise between spherical shape and keying for alignment.

The intercyl shape can be generated by superimposing three identical, orthogonal, circular right cylinders having lengths greater than or equal to the diameter of their cross-section. The axes of the cylinders intersect at one point. The common volume formed by the intersection of the three cylinders is saved, and the rest excluded. In some embodiments, such a shape maybe created with four commands in a 3D CAD system, which is a relatively low number of commands. After NMR quality assurance is performed with the phantom oriented in one direction, the phantom is rotated by 90 degrees to another axis to validate another magnet/gradient combination. A total of three orthogonal orientations of the phantom may be used. After a first experiment is performed, the phantom is removed, rotated to another axis, and re-inserted for a second test. The process is repeated for the third axis. The intercyl shape allows easy alignment of three orthogonal axes to the bore of the magnet and RF coil.

The above embodiments may be altered in many ways without departing from the scope of the invention. For example, in some embodiments the interior of the phantom may not be perfectly spherical, and may be shaped for example as an intercyl surface. Accordingly, the scope of the invention should be determined by the following claims and their legal equivalents.

What is claimed is:

1. A magnetic resonance phantom comprising:
   a casing enclosing an internal chamber; and
   an internal magnetic resonance phantom structure comprising a plurality of stacked plates positioned within the internal chamber, the plurality of plates comprising a plate comprising:
      a base;
      a side wall extending transversely away from the base along a perimeter of the base; and
      a set of air bubble transfer passages spaced at intervals from each other substantially along the perimeter of the base, for allowing air bubbles formed in a liquid situated within the internal chamber to pass between opposite sides of the base as the phantom is rotated.

2. A method for performing a magnetic resonance experiment, the method comprising:
   orienting a magnetic resonance phantom sequentially in three orthogonal orientations within a magnetic resonance instrument by sequentially aligning a plurality of alignment fiducials defined on an outer surface of the phantom with a matching fiducial of the magnetic resonance instrument, the magnetic resonance phantom comprising a spherical or quasi-spherical casing enclosing an internal chamber and an internal magnetic resonance phantom structure situated within the internal chamber; and performing a magnetic resonance evaluation of the phantom in each of the three orthogonal orientations.

3. A magnetic resonance phantom comprising:

a spherical or quasi-spherical casing enclosing an internal chamber, the casing comprising a plurality of orthogonal alignment fiducials defined on an outer surface of the casing and adapted for physically contacting a matching fiducial of a magnetic resonance instrument, for aligning the casing alternatively in three mutually-orthogonal directions within the magnetic resonance instrument; and an internal magnetic resonance phantom structure positioned within the internal chamber.

4. The phantom of claim 3, wherein the plurality of alignment fiducials comprises three orthogonally-positioned registration holes.

5. The phantom of claim 3, wherein the plurality of alignment fiducials comprises three orthogonally-positioned registration protrusions.

6. The phantom of claim 3, wherein the plurality of alignment fiducials comprises three mutually-orthogonal equatorial registration slots.

7. The phantom of claim 3, wherein the plurality of alignment fiducials comprises three mutually-orthogonal equatorial registration ridges.

8. The phantom of claim 3, wherein the casing is substantially spherical.

9. The phantom of claim 8, wherein the internal chamber is substantially spherical.

10. The phantom of claim 3, wherein the internal phantom structure comprises a plurality of stacked parallel plates.

11. The phantom of claim 10, wherein the plurality of stacked parallel plates includes a spatial fiducial plate, a hole array plate, a grid plate, and a folded ramp plate.

12. The phantom of claim 3, wherein the internal phantom structure comprises a plate comprising a base, a side wall extending transversely away from the base along a perimeter of the base, and a set of air bubble transfer passages defined substantially along the perimeter of the base, for allowing air bubbles formed in a liquid situated within the internal chamber to pass between opposite sides of the base as the plate is rotated.

13. The phantom of claim 12, wherein the plate is a spatial fiducial plate comprising a plurality of pins transverse to the base and spaced along the perimeter of the base.

14. The phantom of claim 3, wherein the internal phantom structure comprises a set of air bubble transfer passages defined through the internal phantom structure along an outer region of the internal phantom structure, for allowing air bubbles formed in a liquid situated within the internal chamber to move along the outer region of the internal phantom structure as the internal phantom structure is rotated.

15. The phantom of claim 3, wherein the casing has an overall size larger than 1 cm and smaller than 10 cm, and wherein the internal phantom structure comprises a plurality of stereolithographically-constructed stacked plates.

16. A magnetic resonance phantom comprising:

a generally-rounded casing enclosing an internal chamber, the casing comprising an outer surface defined by a common volume enclosed by an intersection of three identical, orthogonal circular right cylinders; and an internal magnetic resonance phantom structure positioned within the internal chamber.

17. The phantom of claim 16, wherein the internal chamber is substantially spherical.

18. The phantom of claim 16, wherein the casing comprises a liquid access aperture for allowing a liquid to be inserted into the internal chamber.

19. The phantom of claim 16, wherein the internal phantom structure comprises a set of air bubble transfer passages defined through the internal phantom structure along an outer region of the internal phantom structure, for allowing air bubbles formed in a liquid situated within the internal chamber to move along the outer region of the internal phantom structure as the internal phantom structure is rotated.

20. The phantom of claim 16, wherein each of the cylinders has a diameter, and a length equal to or greater than the diameter.

* * * * *